(12) United States Patent
Koroschetz

(10) Patent No.: US 7,683,705 B2
(45) Date of Patent: Mar. 23, 2010

(54) CIRCUIT ARRANGEMENT AND METHOD FOR MATCHING A DEMODULATOR

(75) Inventor: Helmut Koroschetz, Lieboch (AT)

(73) Assignee: Infineon Technologies AG (DE)

( * ) Notice: Subject to any disclaimer, the term of this patent is extended or adjusted under 35 U.S.C. 154(b) by 345 days.

(21) Appl. No.: 11/754,743

(22) Filed: May 29, 2007

(65) Prior Publication Data

US 2007/0279208 A1 Dec. 6, 2007

(30) Foreign Application Priority Data

May 30, 2006 (DE) .................. 10 2006 025 105

(51) Int. Cl.
*H03D 1/06* (2006.01)
*H03D 3/28* (2006.01)
*H03D 99/00* (2006.01)

(52) U.S. Cl. .................. 329/318; 329/349; 329/352; 329/372

(58) Field of Classification Search .................. 329/318, 329/349, 352, 372
See application file for complete search history.

(56) References Cited

U.S. PATENT DOCUMENTS

| 3,202,922 | A | * | 8/1965 | De Schamphelaere | .......... 330/9 |
| 3,273,395 | A | * | 9/1966 | Schwarz | .......... 374/133 |
| 4,024,468 | A | * | 5/1977 | Hirschi | .......... 324/329 |
| 5,461,340 | A | * | 10/1995 | Chahabadi et al. | .......... 329/349 |
| 5,767,670 | A | * | 6/1998 | Maher et al. | .......... 324/207.12 |
| 5,881,364 | A | * | 3/1999 | Higuchi | .......... 340/7.2 |
| 2004/0145452 | A1 | | 7/2004 | Fischer et al. | |

FOREIGN PATENT DOCUMENTS

| DE | 10301451 | 7/2004 |
| EP | 1148645 | 10/2001 |

* cited by examiner

*Primary Examiner*—Evan Pert
(74) *Attorney, Agent, or Firm*—Dickstein, Shapiro, LLP.

(57) ABSTRACT

A circuit arrangement for matching a demodulator to operating conditions comprises a demodulator designed to demodulate an analog input signal to a demodulated signal. The demodulator is also designed to be driven by a control signal. The circuit arrangement further comprises a sensor which is designed to provide a sensor status signal, and a control unit to whose input side the sensor status signal is applied and which is designed to provide the control signal for the demodulator during operation.

34 Claims, 2 Drawing Sheets

CIRCUIT ARRANGEMENT AND METHOD FOR MATCHING A DEMODULATOR

CROSS-REFERENCE TO RELATED APPLICATION

This application claims priority to German Patent Application Serial No. 102006025105.9, which was filed May 30, 2006, and is incorporated herein by reference in its entirety.

FIELD OF THE INVENTION

The invention relates to a circuit arrangement for matching a demodulator to operating conditions. The invention also relates to a method for matching a demodulator to operating conditions.

BACKGROUND

Smart cards are widely used, for many different purposes. The data may be transmitted between the smart card and the reader by the use of contacts, or without contacts. In the case of non-contacting data transmission, the data is transmitted by means of an electromagnetic field.

The smart card has transmitting and receiving devices for bidirectional communication. If only unidirectional communication is intended, the circuitry complexity is reduced as a function of the intended communication direction.

The quality of the data transmission and, associated with it, the transmission reliability between the non-contacting smart card and the reader as well fluctuate, for example because of electromagnetic field strength changes at the location of the receiver. These are caused by distance changes between the smart card and the reader during communication, as can occur when the smart card is used as access authorization to be read on passing by, for example as a ski pass.

A further factor which adversely affects communication is temperature. Severely fluctuating ambient temperatures, which affect smart cards which, for example, are used as access authorization both within and outside buildings, can influence the communication.

Until now, integrated circuits on the smart cards have been designed so as to ensure adequate communication quality for an operating area that is as large as possible, or for the entire relevant operating area. Areas such as these are specified, for example, by the ISO Standard.

One major element for receiving transmitted data is a demodulator, which converts an analog input signal to a demodulated signal, which can be further-processed.

Until now, an analog demodulator such as this was tested before being brought into use, and the drive parameters were optimized for a wide operating area, or for a preferred operating area, and were then stored within the circuitry. The first case represents a compromise solution. In the latter case, discrepancies from the preferred operating area lead to reduced communication quality.

This matching process is carried out only once. The demodulator setting is therefore fixed, and can no longer be changed during operation.

DETAILED DESCRIPTION

Figure 1:
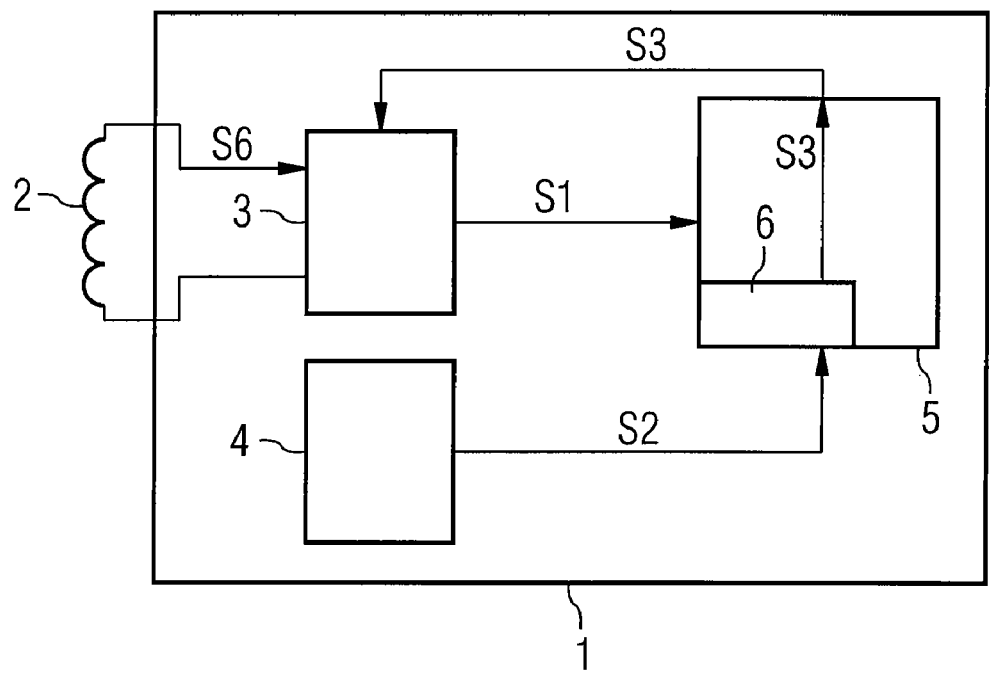
FIG. 1 shows a schematic circuit diagram of one embodiment of a non-contacting interface unit with a demodulator.

One embodiment of a circuit arrangement for matching a demodulator to operating conditions comprises a demodulator which produces a demodulated signal on the output side from an analog input signal applied to the input side and can be driven by a control signal applied to the input side. The demodulator is designed to demodulate an analog input signal to a demodulated signal. The circuit arrangement furthermore comprises a sensor which provides a sensor status signal on the output side, and a control unit to whose input side the sensor status signal is applied and which provides the control signal for the demodulator during operation.

In this embodiment, the operating point of the demodulator can also be adjusted during operation, depending on the control signal for matching. This allows the demodulator to be driven such that it can be optimized for various operating situations. The matching is therefore carried out during operation, for example while data is being transmitted.

In one embodiment, the sensors detect environmental parameters, for example the ambient temperature, which can adversely affect the operating point of the demodulator, or parameters which affect the analog signal and directly influence the communication quality. Examples of this are the electromagnetic field strength and the edge gradient of electromagnetic field strength changes.

In a similar manner to closed-loop control, the control signal in one embodiment is matched continuously and at predetermined intervals, and is fed to the demodulator again in order to readjust the operating point of the demodulator. In one embodiment, the demodulator is matched only when the sensors indicate a significant change in the parameter to be detected, in order to use an energy-efficient procedure to avoid a significant fall in the transmission quality.

In one embodiment, the demodulated data signal is coupled to the control unit in order to additionally use information contained therein to drive the demodulator.

In one embodiment, a demodulator such as this is used in a non-contacting interface unit for a smart card, in order to ensure the communication quality even when the operating conditions are fluctuating severely.

In this application, information relating to the data type and/or the data rate of the data to be transmitted via the interface unit can also be included in the control signal. By way of example, this data may include the demodulator being driven to a greater extent for relatively high data rates than for relatively low data rates.

Suitable measures to influence the operation of the modulator by means of the control signal comprise controlling a current mirror for matching a demodulator window to the field strength, or for matching a bias current.

One embodiment of a method for matching a demodulator to operating conditions comprises:
  demodulating an analog input signal to form a demodulated signal, demodulating is performed in dependence of drive information for the demodulator,
  detecting at least one parameter which affects the operation of the demodulator and/or affects the analog input signal, and providing status information that is dependent on this parameter, and
  providing the drive information for the demodulator in dependence of the status information during operation.

In this method, a change in the parameters which indicate the operating conditions for the demodulator directly influences the demodulator drive. The demodulator is therefore matched during operation.

In one embodiment, the status information comprises the electromagnetic field strength, the edge gradient of the electromagnetic field strength or the temperature, in order to take account not only of parameters which affect the quality of the analog signal but also of parameters which change the demodulation function of the demodulator and necessitate readjustment of the operating point. In one embodiment, the demodulated signal is included as further information in the drive information.

The drive can be changed either continuously or at predetermined intervals in order to ensure demodulation of the same constant high quality. Alternatively or additionally, it can be carried out in an energy-saving manner, by carrying out matching only in the event of major fluctuations in the environmental conditions and/or in the drive information which is dependent on them.

Embodiments will be explained in the following text with reference to the drawing.

FIG. 1 shows one embodiment of a non-contacting interface unit 1, for example for a smart card. The non-contacting interface unit 1 is designed to receive data and to preprocess it for processing, such that it is in digital form and can be processed.

The non-contacting interface 1 comprises an antenna 2 by means of which data and supply energy for the smart card transmitted by means of an electromagnetic field are converted to an analog electrical signal S6.

The analog signal is a modulated signal. By way of example, amplitude modulation or phase-shift keying may be used for modulation. The modulation level depends inter alia on the data rate and the data type. Feasible modulation methods are 100% amplitude modulation, or 60% phase-shift keying. By way of example, a modified Miller coding or Manchester coding may be used as the coding.

An analog demodulator 3 is provided which demodulates the analog signal S6 such that the transmitted information is in the form of a demodulated output signal S1. The digital, demodulated signal S1 is produced on the output side of the demodulator 3, and is supplied to a digital circuit area 5. The demodulated signal S1 is processed in the digital circuit area 5.

The circuit arrangement comprises a control unit 6 to drive the demodulator 3, with a control signal S3 being produced, which is coupled to the demodulator 3.

Furthermore, the non-contacting interface unit 1 comprises a sensor 4 which detects at least one environmental parameter and, as a function of it, emits a sensor status signal S2 which is coupled to the input side of the control unit 6.

In this embodiment, only one sensor 4 is provided, and, for example, is in the form of a temperature sensor. Other parameters which affect the operation of the demodulator and the demodulation quality can also expediently be detected.

The control unit 6 generates the control signal S3 as a function of the sensor status signal S2 such that the drive for the demodulator 3, to be precise its operating point, is matched to the temperature. This makes it possible to vary the demodulation characteristics of the demodulator 3. Any change in the demodulation function associated with the change in the ambient temperature is thus countered in order to optimize the demodulation, and thus the data transmission for the changing environmental conditions. The processing within the control unit 6 is normally carried out digitally, so that it is advantageous for the input and output signals to be in the form of digital signals.

Figure 2:
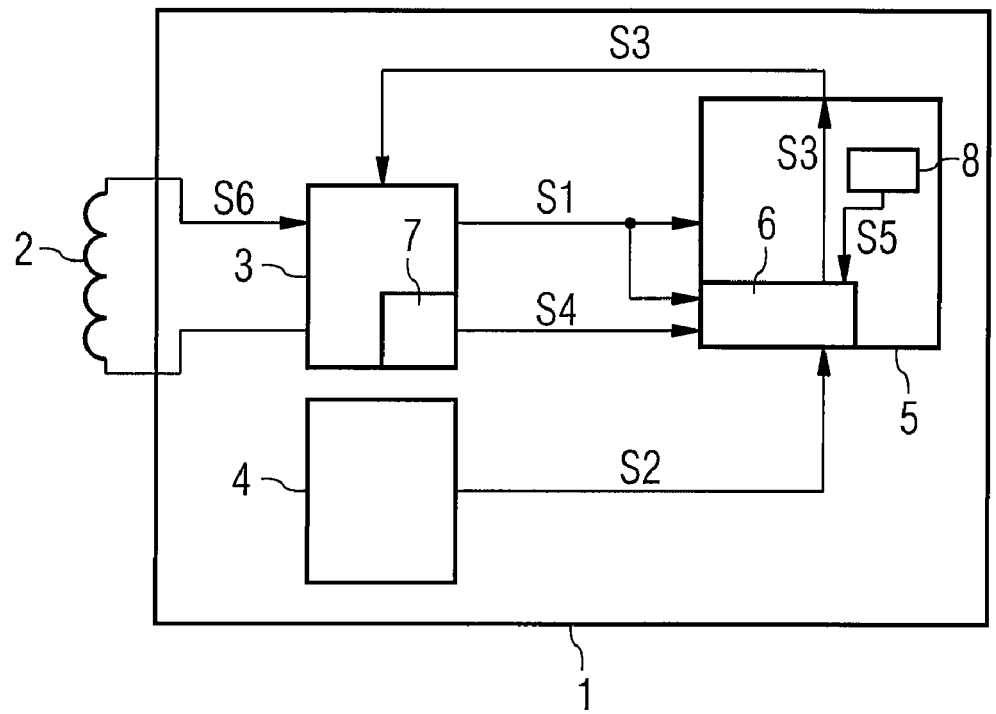
FIG. 2 shows a schematic circuit diagram of a further embodiment of a non-contacting interface unit with a demodulator.

FIG. 2 shows a development of a non-contacting interface.

The same reference symbols denote identical circuit parts. In order to avoid repetition, the corresponding arrangements will be described only once.

A further sensor 7 is provided in FIG. 2 and is designed to detect the field strength of the electromagnetic field which is detected by the antenna 2, and to emit a field-strength information signal S4 as a function of this. This field-strength information signal S4 is coupled to the control unit 6.

By way of example, the field strength may be measured in parallel with the demodulation, as is indicated by the coupling of the further sensor 7 to the demodulator 3.

The control signal S3 is generated as a function of the field-strength information signal S4 and of the sensor status signal S2. The field-strength information signal S4 is used to match the operating point of the demodulator 3 to the environmental parameters, which are affecting the operation of the demodulator 3. The sensor status signal S2 is used to match the operating point of the demodulator 3 to parameters which are affecting the analog signal S6. The latter is advantageous, for example, when the field strength falls during the modulating process in the transmitter.

Even more accurate matching of the demodulator is made possible by the use of a plurality of sensors 4, 7, in this case a field-strength sensor and, furthermore by way of example, a temperature sensor. This effect can be increased by the use of further sensors, whose sensor status signals are likewise included in the control signal S3.

In order to achieve even more accurate matching of the demodulator 3, the demodulated signal in FIG. 2 is also supplied to the control unit and acts on the control signal, S1, for example when a block of identical bits is being transmitted.

In FIG. 2, provision is also made for a signal S5 to be supplied to the control unit 6 within the digital circuit area 5.

By way of example, the internal signal S5 may be information, produced by means of software and stored in a register 8, about the data rate to be transmitted or about the data type to be transmitted.

This information can also be used for tuning the demodulator 3 for the control signal S3.

The control unit 3 may feed the control signal S3 to the demodulator 3 once again continuously or at regular intervals in order to ensure the same or nearly the same constant demodulation, and therefore transmission, quality. In this case, by way of example, the intervals may depend on the data rate and the data type.

If the intention is to detect only major fluctuations in the environmental parameter and/or the field strength, it is sufficient just to check in the control unit 6 whether the sensor status signals S4, S2 deviate from a predetermined value. The demodulator is matched once again by a change in the control signal S3 only in the event of major fluctuations, in order to achieve a minimum demodulation quality.

Figure 3:
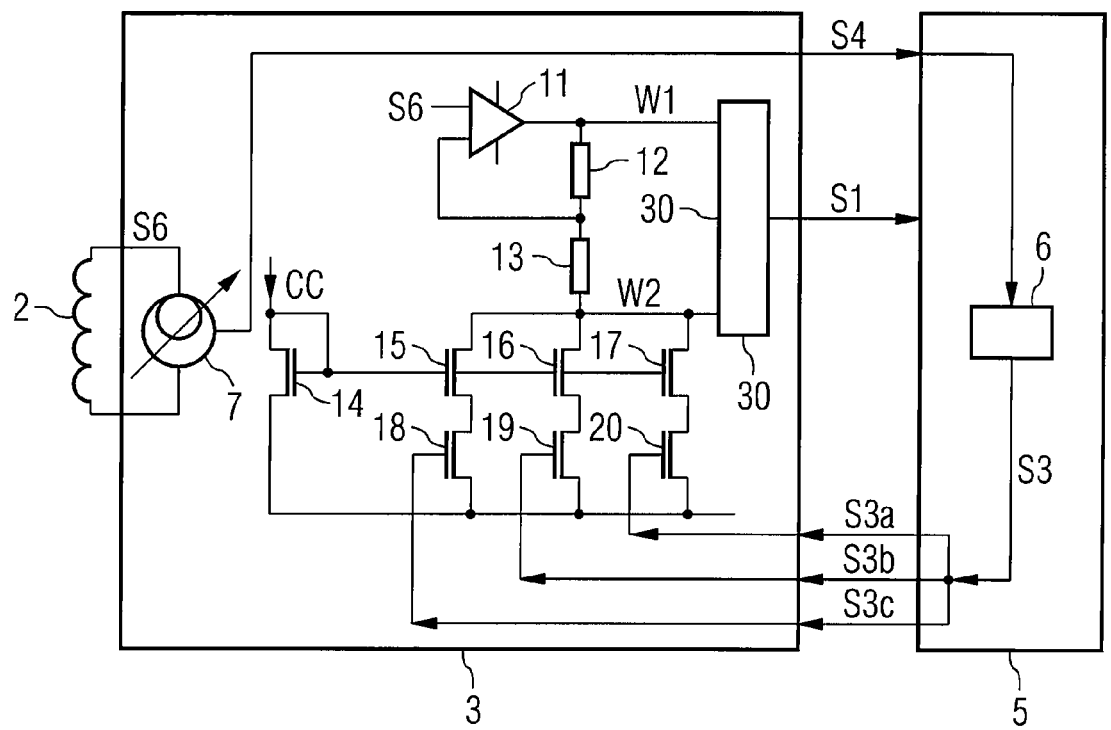
FIG. 3 shows an embodiment relating to the control of a demodulator window.

FIG. 3 shows a circuit diagram of the major elements, in order to illustrate the control of a demodulator window. Fluctuations within the analog signal S6 occurring within the demodulator window are detected by the demodulator 3. If the window is chosen to be too small, overshoots may be detected as false signals. If the window is chosen to be too large, this will adversely affect the accuracy. However, matching must be carried out to a greater extent when the modulation level is low than when the modulation level is high.

The demodulator 3 comprises a field-strength sensor 7, to which the analog signal S6 is coupled from the antenna 2. The field-strength sensor 7 itself produces a sensor status signal S4 which is dependent on the field strength and is coupled to the control unit 6, which is surrounded by the digital unit 5.

A demodulating unit 30 for the analog signal S6 is driven by applying to its input side a first potential W1 and a second potential W2, which is lower than the first potential W1. The potentials W1, W2 define the upper and lower limits of the demodulator window.

A voltage divider having a first resistor 12 and a second resistor 13 is connected in parallel with the inputs, for application of the first and second potentials W1, W2. The potential is tapped off between the resistors 12, 13, and is supplied in the same way as the analog signal S6 to a differential amplifier 11, whose output signal provides the first potential W1.

The second potential W2 is at the same potential node as the output of a current mirror, which mirrors a constant current CC, with the transistors 14, 15, 16, 17. The output current is generated by three parallel current paths, in each case comprising one of the transistors 15, 16, 17 which can be interrupted by a respective switch 18, 19, 20, with the output current depending on the switch position of the switches 18, 19, 20.

Control signals S3a, S3b, S3c for driving the switches 18, 19, 20 are generated by the control unit 6. The output current of the current mirror and therefore the second potential W2 for controlling the demodulator window are therefore controlled as a function of the field strength.

Figure 4:
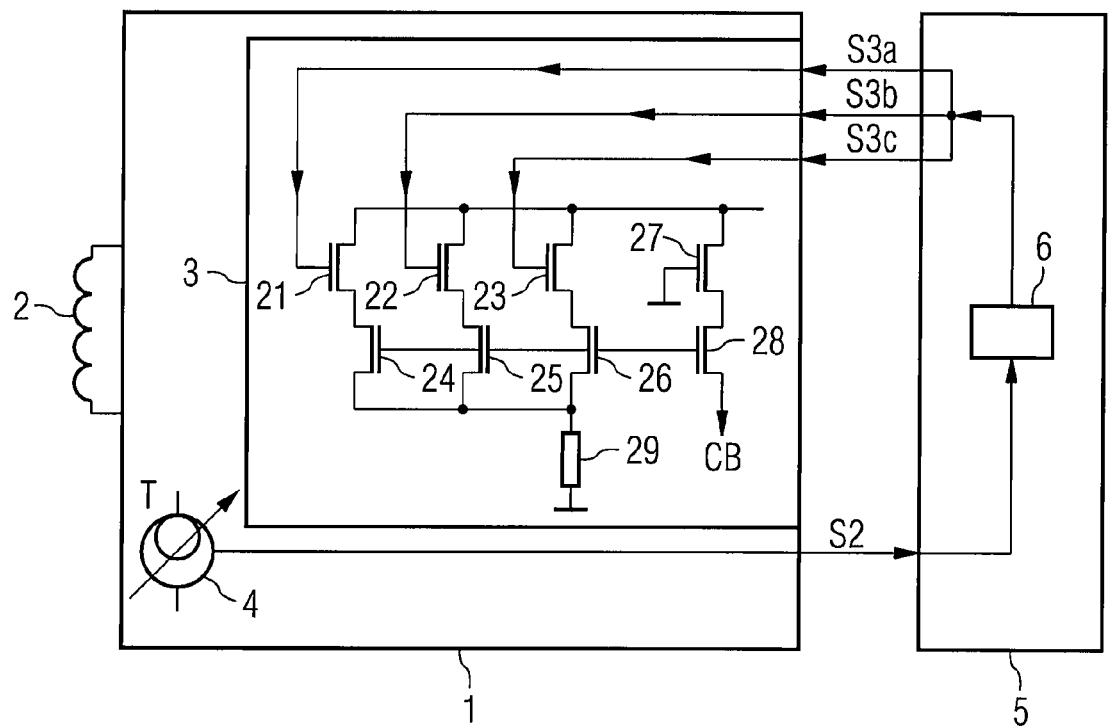
FIG. 4 shows an embodiment relating to the control of a bias current.

FIG. 4 shows a schematic circuit diagram of the major elements for controlling a bias current.

In this arrangement, a temperature sensor 4 is provided and, as a function of the temperature T, generates the sensor status signal S2, which is coupled to the control unit 6, which in turn is surrounded by the digital unit 5.

A current mirror in the demodulator 3 comprises the parallel transistors 24, 25, 26, each of whose current paths can be switched by the respective switches 21, 22, 23. The resultant current feeds a load 29 which, for example, may comprise a part of the demodulator 3. A mirrored bias current CB flows through the transistors 27, 28 as a function of the switch positions of the switches 21, 22, 23. The bias current CB is used, for example, to adjust the operating point of the demodulator.

It should be noted that the embodiments described and illustrated in FIGS. 3 and 4 comprise exemplary measures in order to match the demodulator to operating conditions. These measures may be combined. Other measures for matching the demodulator operation, but which follow different approaches or approaches going beyond them, are, of course, also feasible.

The use of the invention is, of course, not restricted to smart cards, and the invention is also applicable in other fields, not only for communication, in which a demodulator is used.

What is claimed is:

1. A circuit arrangement for matching a demodulator to operating conditions, comprising:
   a demodulator designed to demodulate an analog input signal to a demodulated signal, wherein the demodulator is designed to be driven by a control signal;
   a sensor designed to detect a parameter which affects the operation of the demodulator, and to provide a sensor status signal; and
   a control unit to whose input side the sensor status signal is applied and which is designed to provide the control signal for the demodulator during operation.

2. The circuit arrangement as claimed in claim 1, wherein the sensor is designed to detect a parameter which affects the analog input signal.

3. The circuit arrangement as claimed in claim 1, wherein the sensor is in the form of a temperature sensor.

4. The circuit arrangement as claimed in claim 1, wherein the sensor is designed to detect an electromagnetic field strength.

5. The circuit arrangement as claimed in claim 1, wherein the sensor is coupled to the demodulator.

6. The circuit arrangement as claimed in claim 1, wherein the sensor is designed to detect an edge gradient of an electromagnetic field-strength change.

7. The circuit arrangement as claimed in claim 1, wherein the control unit is designed to match the control signal continuously or at predetermined intervals.

8. The circuit arrangement as claimed in claim 1, wherein the control unit is designed to match the control signal when the control signal changes by at least a predetermined value, or when the sensor status signal changes by at least a predetermined value.

9. The circuit arrangement as claimed in claim 1, wherein the demodulated data signal is coupled to the control unit.

10. The circuit arrangement as claimed in claim 1, wherein the control signal controls a demodulator window for the demodulator.

11. The circuit arrangement as claimed in claim 1, wherein the control signal controls a bias current.

12. The circuit arrangement as claimed in claim 1, wherein the demodulator comprises a current mirror which can be controlled by the control signal.

13. A non-contacting interface unit which comprises a circuit arrangement as claimed in claim 1.

14. The non-contacting interface unit as claimed in claim 13, wherein the control signal depends on the data type and/or the data rate of the data to be transmitted via the interface unit.

15. A circuit arrangement for matching a demodulator to operating conditions, comprising:
   a demodulator designed to demodulate an analog input signal to a demodulated signal provided on the output side, wherein the demodulator is driven by a control signal;
   a sensor designed to detect a parameter that influences the operation of the demodulator and which provides a sensor status signal; and
   a control unit to whose input side the sensor status signal is applied and which is designed to provide the control signal for the demodulator during operation.

16. The circuit arrangement as claimed in claim 15, wherein the sensor is in the form of a temperature sensor.

17. The circuit arrangement as claimed in claim 15, wherein the sensor is designed to detect a variable of the electromagnetic field.

18. The circuit arrangement as claimed in claim 15, wherein the control unit is designed to match and to provide the control signal continuously or at predetermined intervals.

19. The circuit arrangement as claimed in claim 15, wherein the control unit is designed to match and to provide the control signal whenever the control signal changes by at least a predetermined value, or when the sensor status signal changes by at least a predetermined value.

20. The circuit arrangement as claimed in claim 15, wherein the control signal controls a demodulator window for the demodulator.

21. The circuit arrangement as claimed in claim 15, wherein the control signal controls a bias current.

22. The circuit arrangement as claimed in claim 15, wherein the demodulator comprises a current mirror which can be controlled by the control signal.

23. A method for matching a demodulator to operating conditions, comprising:
- demodulating an analog input signal to form a demodulated signal, wherein the demodulating is performed in dependence on drive information for the demodulator;
- detecting at least one parameter which affects the operation of the demodulator, and providing status information that is dependent on this parameter; and
- providing the drive information for the demodulator in dependence of the status information during operation.

24. The method as claimed in claim 23, wherein the status information is temperature-dependent.

25. The method as claimed in claim 23, wherein the status information is dependent on an electromagnetic field strength.

26. The method as claimed in claim 24, wherein the at least one parameter is detected in parallel with the demodulating.

27. The method as claimed in claim 23, wherein the status information is dependent on an edge gradient of an electromagnetic field strength.

28. The method as claimed in claim 23, wherein the drive information for the demodulator is provided continuously or at predetermined intervals.

29. The method as claimed in claim 23, wherein the drive information for the demodulator is provided when the status information changes by at least a predetermined value or the drive information changes by at least a predetermined value.

30. The method as claimed in claim 23, wherein the drive information depends on the demodulated data signal.

31. The method as claimed in claim 23, wherein the control signal controls a demodulator window for the demodulator.

32. The method as claimed in claim 23, wherein the control signal controls a bias current.

33. The method as claimed in claim 23, wherein the control signal controls a current mirror.

34. A circuit arrangement for matching a demodulator to operating conditions, comprising:
- a demodulating means for demodulating an analog input signal to a demodulated signal, wherein the demodulating means is driven by a control signal;
- a sensing means for detecting a parameter which affects the operation of the demodulating means, and for providing a sensor status signal; and
- a control means, to whose input side the sensor status signal is applied, for providing the control signal for the demodulating means during operation.

* * * * *